(12) United States Patent
Lehtinen et al.

(10) Patent No.: US 8,081,042 B2
(45) Date of Patent: Dec. 20, 2011

(54) APPARATUS, METHOD AND COMPUTER PROGRAM

(75) Inventors: Teijo Lehtinen, Helsinki (FI); Simo Murtojarvi, Salo (FI)

(73) Assignee: Nokia Corporation, Espoo (FI)

(*) Notice: Subject to any disclaimer, the term of this patent is extended or adjusted under 35 U.S.C. 154(b) by 164 days.

(21) Appl. No.: 12/454,635

(22) Filed: May 19, 2009

(65) Prior Publication Data

US 2010/0295628 A1     Nov. 25, 2010

(51) Int. Cl.
*H03C 3/00* (2006.01)

(52) U.S. Cl. .......................... 332/144; 332/103

(58) Field of Classification Search ............ 332/144, 332/103
See application file for complete search history.

(56) References Cited

U.S. PATENT DOCUMENTS

| | | | |
|---|---|---|---|
| 3,810,018 A * | 5/1974 | Stover .............................. | 455/42 |
| 5,559,475 A * | 9/1996 | Fukuyama ...................... | 331/31 |
| 6,028,493 A | 2/2000 | Olgaard et al. | |
| 6,307,411 B1 | 10/2001 | Kerner | |
| 6,597,247 B1 | 7/2003 | Buoli et al. | |
| 7,224,948 B1 | 5/2007 | Yanawaki et al. | |
| 2001/0036240 A1 | 11/2001 | Gossmann et al. | |
| 2006/0082417 A1 | 4/2006 | Neurauter et al. | |
| 2006/0267692 A1 | 11/2006 | Tanaka | |
| 2008/0192877 A1 | 8/2008 | Eliezer et al. .................. | 375/376 |
| 2008/0311860 A1 | 12/2008 | Tanaka et al. | |

FOREIGN PATENT DOCUMENTS

| | | |
|---|---|---|
| EP | 1198064 A2 | 4/2002 |
| EP | 1248378 A1 | 10/2002 |
| JP | 2003152558 A1 | 5/2003 |
| WO | 0048318 A1 | 8/2000 |

OTHER PUBLICATIONS

International Search Report and Written Opinion dated Aug. 20, 2010 in corresponding International Patent Application No. PCT/FI2010/050314 including transmittal (3 pages), Search Report (5 pages) and Written Opinion (7 pages).
Eliezer et al., "Active Mitigation of Induced Phase Distortion in a GSM SoC," 2008 IEEE Radio Frequency Integrated Circuits Symposium, Jun. 17, 2008-Apr. 17, 17, 2008, current version published Jul. 15, 2008, pp. 17-20.
Weldon et al., "A 1.75-GHz Highly Integrated Narrow-Band CMOS Transmitter With Harmonic-Rejection Mixers," IEEE Journal of Solid-State Circuits, Dec. 2001, current version published Aug. 6, 2002, pp. 2003-2015, vol. 36, No. 12, San Francisco, CA, USA.
Su, "A 0.25-micron CMOS OPLL Transmitter IC for GSM and DCS Applications," IEEE Transactions on Microwave Theory and Techniques, Feb. 2005, current version published Feb. 14, 2005, pp. 462-471, vol. 53, Issue 2, Scottsdale, AZ, USA.
Patent Abstracts of Japan, English Abstract of JP publication No. 2003152558, application published May 23, 2003, 1 page.

* cited by examiner

*Primary Examiner* — Joseph Chang

(57) ABSTRACT

An apparatus, method and computer program, the apparatus including: a modulator including a first input for receiving a data signal and a second input for receiving an output signal from a phase locked loop wherein the modulator is for modulating the output signal from the phase locked loop using the data signal and providing the modulated signal to an output for connection to an amplifier; and a phase shifter configured to result in a predetermined phase shift to the modulated signal.

21 Claims, 6 Drawing Sheets

APPARATUS, METHOD AND COMPUTER PROGRAM

FIELD OF THE INVENTION

Embodiments of the present invention relate to an apparatus, method and computer program. In particular, they relate to an apparatus, method and computer program for reducing degradation in performance caused by coupling between components within an electric apparatus.

BACKGROUND TO THE INVENTION

Unwanted coupling between components within an electric apparatus can degrade the performance of the apparatus. For example, a transmitter may be connected to circuitry which generates the signal to be transmitted. The transmitter may comprise components such as amplifiers which may be necessary to drive an antenna, however the high powered signals generated by the amplifiers may couple with other parts of the signal generating circuitry. This may disturb the other components in the apparatus, in particular it may disturb sensitive components such as phase locked loops which may affect the transmitted signal. For example it may increase the phase error in the transmitted signal.

It would be useful to reduce the effect that such coupling has on the other components in the apparatus and consequently the transmitted signal.

BRIEF DESCRIPTION OF VARIOUS EMBODIMENTS OF THE INVENTION

According to various, but not necessarily all, embodiments of the invention there is provided an apparatus comprising: a modulator comprising a first input for receiving a data signal and a second input for receiving an output signal from a phase locked loop wherein the modulator is for modulating the output signal from the phase locked loop using the data signal and providing the modulated signal to an output for connection to an amplifier; and a phase shifter configured to result in a predetermined phase shift to the modulated signal.

In some embodiments of the invention the phase shifter may be configured to add the predetermined phase shift to the data signal which is provided to the modulator.

In some embodiments of the invention the predetermined phase shift may be dependent upon the temperature of the apparatus and/or the frequency of the output signal of the phase locked loop.

In some embodiments of the invention the predetermined phase shift may be independent of the data signal.

In some embodiments of the invention the predetermined phase shift may prevent an interfering signal from having the same phase as the output signal of the phase locked loop. The interfering signal may be an output signal of an amplifier or an antenna.

In some embodiments of the invention the apparatus may comprise a further modulator comprising a first input for receiving a data signal and a second input for receiving an output signal from a phase locked loop wherein the modulator is for modulating the output signal from the phase locked loop using the data signal and providing the modulated signal to an output for connection to an amplifier. The output signal of the phase locked loop may be phase shifted by ninety degrees before being provided to the further modulator so that the modulated output signals of the modulators are in quadrature to each other. The apparatus may comprise a phase shifter configured to result in a predetermined phase shift to the modulated output signal of the further modulator. The predetermined phase shift provided to the further modulator may keep the first signal and the second signal in quadrature. The outputs of the two modulators may be added together before being provided to the amplifier.

According to various, but not necessarily all, embodiments of the invention there is provided a method comprising: modulating, using a data signal, an output signal from a phase locked loop; adding a predetermined phase shift such that the predetermined phase shift results in a phase shift of the modulated signal; and providing the modulated signal for connection to a amplifier.

In some embodiments of the invention the predetermined phase shift may be added to the data signal.

In some embodiments of the invention the predetermined phase shift is dependent upon the temperature of the apparatus and/or the frequency of the output signal of the phase locked loop.

In some embodiments of the invention the predetermined phase shift may be independent of the data signal.

In some embodiments of the invention the predetermined phase shift may prevent an interfering signal from having the same phase as the output signal of the phase locked loop. The interfering signal may be an output signal of an amplifier or an antenna.

In some embodiments of the invention the method may also comprise splitting the output signal of the phase locked loop into a first signal and a second signal and introducing a ninety degree phase shift to the first signal so that the first signal and the second signal are in quadrature with each other and both the first signal and the second signal are modulated with a data signal. A predetermined phase shift may be added to both the first signal and the second signal so that the first signal and the second signal remain in quadrature. The first modulated signal may be added to the second modulated signal before providing the signals to the amplifier.

According to various, but not necessarily all, embodiments of the invention there is provided a computer program comprising computer program instruction means configured to control an apparatus, the program instructions enabling, when loaded into a processor; modulating, using a data signal, an output signal from a phase locked loop; adding a predetermined phase shift such that the predetermined phase shift results in a phase shift of the modulated signal; and providing the modulated signal for connection to an amplifier.

In some embodiments of the invention there may be provided a computer program comprising program instructions for causing a computer to perform the method as described above.

In some embodiments of the invention there may be provided an electromagnetic carrier signal carrying the computer program as described above.

In some embodiments of the invention there may be provided a computer-readable storage medium encoded with instructions that, when executed by a processor, perform the method as described above.

According to various, but not necessarily all, embodiments of the invention there is provided an apparatus comprising: a phase locked loop for providing an output signal at a first frequency; a modulator comprising a first input for receiving a data signal and a second input for receiving an output signal from a phase locked loop wherein the modulator is for modulating the output signal from the phase locked loop using the data signal and providing the modulated signal to an output; an amplifier connected to receive the modulated signal from the modulator; and a phase shifter configured to introduce a predetermined phase shift into the signal provided to the amplifier wherein the phase shift is configured to reduce the effect of coupling between the amplifier and the phase locked loop to stabilise the output of the phase locked loop.

In some embodiments of the invention the phase shifter may be configured to add the predetermined phase shift to the data signal which is provided to the modulator.

In some embodiments of the invention the predetermined phase shift may be dependent upon the temperature of the apparatus and/or the frequency of the output signal of the phase locked loop.

In some embodiments of the invention the predetermined phase shift may be independent of the data signal.

In some embodiments of the invention the amplifier may be connected to an antenna for transmitting the modulated signal.

According to various, but not necessarily all, embodiments of the invention there is provided an apparatus comprising: a phase locked loop for providing an output signal at a first frequency; and a phase shifter configured to result in a predetermined phase shift being added to the output signal wherein the predetermined phase shift is configured to reduce the effect of coupling between the phase locked loop and components connected to the phase locked loop to stabilize the output of the phase locked loop.

According to various, but not necessarily all, embodiments of the invention there is provided an apparatus comprising: an amplifier comprising an input for receiving a modulated signal from a modulator; and a phase shifter configured to result in a predetermined phase shift to the modulated signal.

The apparatus may be for enabling transmission of a signal. For example the apparatus may be a module or a chip set within a wireless communications device.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
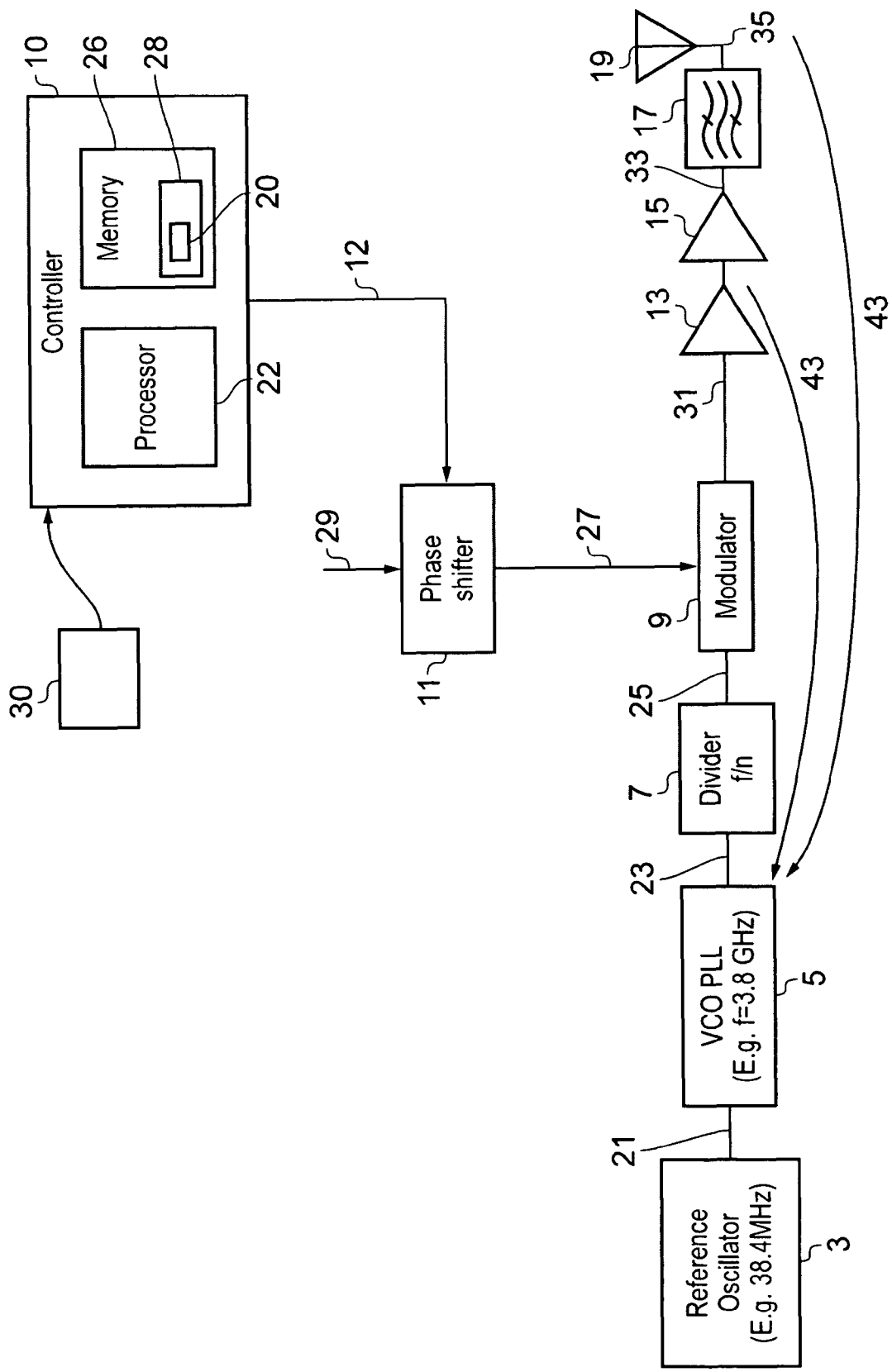
FIG. 1 is a schematic diagram of an apparatus according to an embodiment of the invention.

The Figures illustrate an apparatus 1 comprising: a modulator 9 comprising a first input for receiving a data signal 27 and a second input for receiving an output signal 23 from a phase locked loop 5 wherein the modulator 9 is for modulating the output signal 23 from the phase locked loop 5 using the data signal 27 and providing the modulated signal 29 to an output for connection to an amplifier 13; and a phase shifter 11 configured to result in a predetermined phase shift to the modulated signal 29.

In the following description, unless expressly stated otherwise, the words "connect" and "couple" and their derivatives mean operationally connected or operationally coupled. It is to be appreciated that any number or combination of intervening components can exist including no intervening components.

FIG. 1 schematically illustrates an apparatus 1 according to an embodiment of the invention. The apparatus 1 illustrated in FIG. 1 comprises a reference oscillator 3, a phase locked loop 5, a divider 7, a phase shifter 11, a modulator 9, amplifiers 13, 15 including at least one power amplifier, a filter 17 and an antenna 19.

The reference oscillator 3 provides an oscillating reference signal 21. In the illustrated embodiment the reference oscillator 3 provides a reference signal 21 with a frequency of 38.4 MHz. In other embodiments of the invention the reference oscillator 3 may provide a signal with a different frequency. The frequency of the reference signal 21 used may depend upon the frequency band in which the antenna 19 is transmitting.

The reference oscillator 3 may be, for example, a digitally controlled crystal oscillator.

The reference oscillator 3 is coupled to the phase locked loop 5. The oscillating reference signal 21 is provided as an input to the phase locked loop 5.

The phase locked loop 5 comprises a voltage controlled oscillator which is configured to provide the output signal 23 of the phase locked loop 5. The phase locked loop 5 may generate a carrier signal which may be used to enable data to be transmitted. In the illustrated embodiment the output signal 23 of the phase locked loop 5 has a frequency of 3.8 GHz.

The input of the phase locked loop 5 is coupled to the reference oscillator 3 so that the reference signal 21 generated by the reference oscillator is provided as an input signal to the phase locked loop 5. In some embodiments of the invention there may be intervening components between the reference oscillator 3 and the phase locked loop 5.

The output of the phase locked loop 5 is connected to the modulator 9. It is to be appreciated that the modulator 9 may receive the output signal 23 from the phase locked loop 5 either directly or indirectly. In the illustrated embodiment the phase locked loop 5 is connected to the modulator 9 via a frequency divider 7 so that the modulator 9 receives the output signal 23 of the phase locked loop 5 directly. The frequency divider 7 divides the frequency of the output signal 23 of the phase locked loop 5 by the integer n to create a reduced frequency signal 25.

The value of the integer n may be dependent upon the frequency band in which the signal is to be transmitted. For example, in embodiments where the apparatus 1 is for generating a high band wireless communications signal n may be two. Similarly if the apparatus 1 is for generating a low band wireless communications signal n may be four. The value of the integer n may also depend upon the frequency of the output signal 23 of the phase locked loop 5.

The modulator 9 is connected to the phase locked loop 5. It receives the reduced frequency signal 25 from the frequency divider 7 as a first input.

In other embodiments of the invention there may be no intervening components between the phase locked loop 5 and the modulator 9. For example there may be no frequency divider 7 so that the modulator 9 receives the output signal 23 of the phase locked loop 5 directly without any change to the frequency of the output signal 23.

The modulator 9 also receives a second input comprising a data signal 27. The data signal 27 comprises the data that is to be transmitted by the antenna 19.

The modulator 9 modulates the reduced frequency signal 25 with the data of the data signal 27 to provide a modulated signal 31 to an output.

The output of the modulator 9 may be connected to amplifiers 13, 15. It is to be appreciated that in some embodiments of the invention intervening components may be connected between the modulator 9 and the amplifiers 13, 15.

In the embodiment illustrated in FIG. 1 a phase shifter 11 introduces a predetermined phase shift into the data signal 27 before it is provided to the modulator 9. The phase shifter 11 receives the non-phase shifted data signal 29 as an input and provides the phase shifted data signal 27 as an output. This results in a predetermined phase shift being added to the output signal 31 of the modulator 9. It is to be appreciated that in other embodiments of the invention the phase shifter 11 may be configured to add the predetermined phase shift into another signal such as the reduced frequency signal 25 provided to the modulator 9 or directly into the output signal 31 of the modulator 9.

In some embodiments of the invention the phase shifter 11 may be connected to a controller 10. The controller 10 may be configured to provide a control signal 12 to the phase shifter 11 to control the value of the predetermined phase shift which is added to the modulated signal 31.

The controller 10 may be implemented using instructions that enable hardware functionality, for example, by using executable computer program instructions 20 in a general-purpose or special-purpose processor 22 that may be stored on a computer readable storage medium 24 (e.g. disk, memory etc) to be executed by such a processor 22.

In some embodiments of the invention the controller 10 may comprise a processor 22 and a memory 26. The memory 26 may store a computer program 28 comprising computer program instructions 20 that control the operation of the apparatus 1 when loaded into the processor 22. The computer program instructions 20 provide the logic and routines that enable the apparatus 1 to perform the method illustrated in FIG. 5. The processor 22 by reading the memory 26 is able to load and execute the computer program 28.

The computer program instructions 20 may provide computer readable program means for modulating, using a data signal 27, an output signal 23 from a phase locked loop 5; adding a predetermined phase shift to the modulated signal 29; and providing the modulated signal 29 for connection to an amplifier 13, 15.

The computer program 28 may arrive at the apparatus 1 via any suitable delivery mechanism 30. The delivery mechanism 30 may be, for example, a computer-readable storage medium, a computer program product, a memory device such as a flash memory, a record medium such as a CD-ROM or DVD, an article of manufacture that tangibly embodies the computer program 28. The delivery mechanism 30 may be a signal configured to reliably transfer the computer program 28. The apparatus 1 may propagate or transmit the computer program 28 as a computer data signal.

Although the memory 26 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (e.g. Von Neumann)/parallel architectures but also specialized circuits such as field-programmable gate arrays (FPGA), application specific integration circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device.

In the illustrated embodiment the controller 10 provides a control signal 12 to the phase shifter 11. It is to be appreciated that the controller 10 may be configured to provide control signals to other components in the apparatus 1. In other embodiments of the invention further controllers may be provided to provide control signals to other components.

The value of the predetermined phase shift which is added by the phase shifter 11 may be obtained from a look up table. The look up table may be stored in the memory of the controller 10. The values in the look up table may be obtained through calibration measurements of the apparatus 1. Alternatively the values in the look up table may be obtained using a theoretical model of how the apparatus 1 is expected to perform.

The value of the predetermined phase shift which is added may depend upon the frequency of the carrier signal, that is, the frequency of the input signal 25 which is provided to the modulator 9. In some embodiments of the invention the value of the phase shift added may also be dependent upon the temperature of the apparatus 1. As the temperature of the apparatus 1 may vary during use the value of the predetermined phase shift added may also vary as the apparatus 1 is used.

The predetermined phase shift which is added may be independent of the data signal 27. All signals may be shifted by the same amount irrespective of the data values which have been used to modulate the signals.

The predetermined phase shift which is added may ensure that the output signal 23 of the phase locked loop 5 is not in phase with an interfering signal. The interfering signal may be generated by the amplifiers 13, 15 or the antenna 19.

The amplifiers 13, 15 are connected to the modulator 9. The modulated signal 31 is provided as an input to the amplifiers 13, 15. The amplifiers 13, 15 include at least one power amplifier for increasing the power of the modulated signal 31 to provide an amplified signal 33 for driving the antenna 19.

The amplifiers 13, 15 are also connected to the antenna 19. In the illustrated embodiment the amplifiers 13, 15 are connected to the antenna 19 via a filter 17 such as a bandpass filter. The amplified signal 33 is filtered by the filter 17 to create the filtered signal 35 which is provided to the antenna 19 for transmission.

The amplifiers 13, 15 and the amplified signal 33 are high powered compared to the other components in the apparatus 1 and may couple to other components in the apparatus 1. The arrows 43 indicate possible coupling paths between the amplified signal 33 and the phase locked loop 5. This coupling may affect sensitive components such as the phase locked loop 5.

For example it may cause a variation in phase of the output signal 23 of the phase locked loop 5.

For example the phase locked loop 5 comprises a phase comparator which compares the phase of the reference signal 21 with the output signal of the voltage controlled oscillator of the phase locked loop 5. The output signal 23 may be fed back into the phase locked loop 5 via a frequency divider. The interfering signals 43 may couple to the output signal 23 of the phase locked loop 5. The phase comparator is not able to differentiate between the interfering signal 43 and the output signal 23 which is fed back into the phase locked loop 5. This may result in the phase locked loop 5 locking to the interfering signal rather than the output signal which results in a phase error in the output signal 23 of the phase locked loop 5.

The signals which couple to the other components may be harmonics of the signals generated by the amplifiers 13, 15. For example in embodiments of the invention where the frequency divider 7 divides the frequency of the output signal 23 of the phase locked loop 5 by two the second harmonic of the amplified signal 33 may cause the most disturbance as this has the same frequency as the output signal 23 of the phase locked loop 5. Similarly in embodiments of the invention where the frequency divider 7 divides the frequency of the output signal 23 of the phase locked loop 5 by four the fourth harmonic of the amplified signal 33 may cause the most disturbance.

The effect of the coupling may be worst when the interfering signal 43 has the same frequency and the same phase as the output signal 23 from the phase locked loop 5.

However, in embodiments of the invention the predetermined phase shift added by the phase shifter 11 reduces the effect of this coupling. The predetermined phase shift added by the phase shifter 11 may prevent the amplified signal 33 and therefore the interfering signals 43 from having the same phase as the output signal 23 of the phase locked loop. This reduces the effect of the coupling and stabilises the output signal 23 of the phase locked loop 5. The reduction in the effect of the coupling may be measured as a reduction in the phase error of the signal which is transmitted by the antenna 19 or as a reduction in the adjacent channel power ratio of the signal transmitted by the antenna 19.

Figure 2:
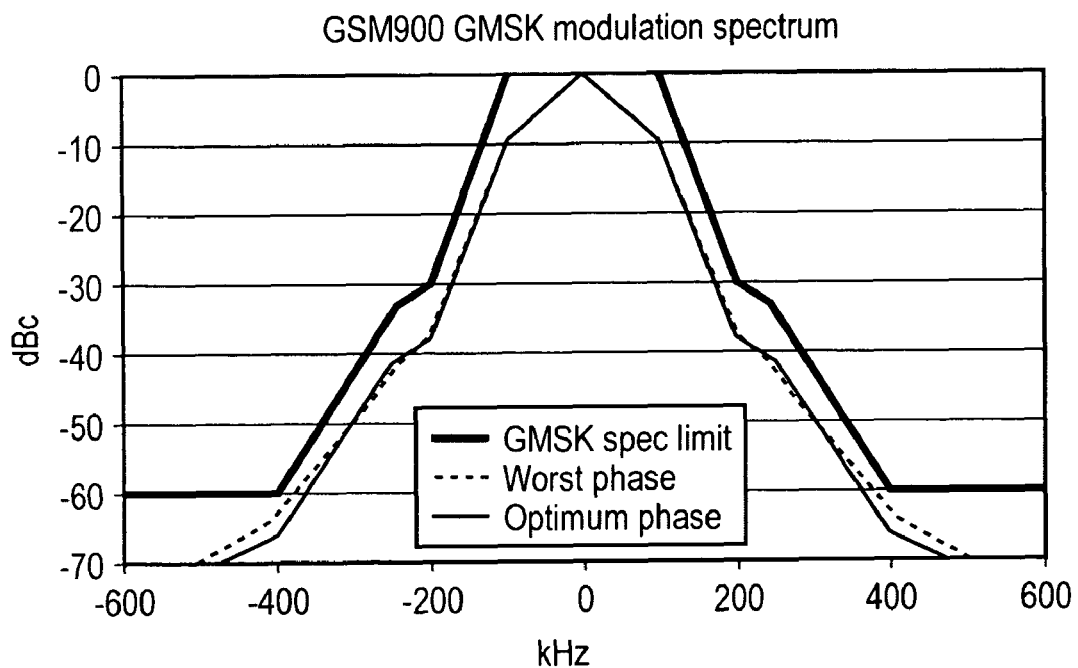
FIG. 2 is a plot of a modulation spectrum which may be used in embodiments of the invention.

FIG. 2 is a plot of a modulation spectrum of GSM900 transmission signal which may be used in embodiments of the invention. The thick solid line indicates the transmission mask for the standard specification. The thin solid line indicates the signal spectrum where the amplified signals have optimum phase compared to the output of the phase locked loop 5 and the dashed line indicates the signal spectrum with the worst phase difference.

In FIG. 2 it can be seen that the phase difference affects the performance of the apparatus 1 particularly at the offset frequencies around 400 KHz.

Figure 3:
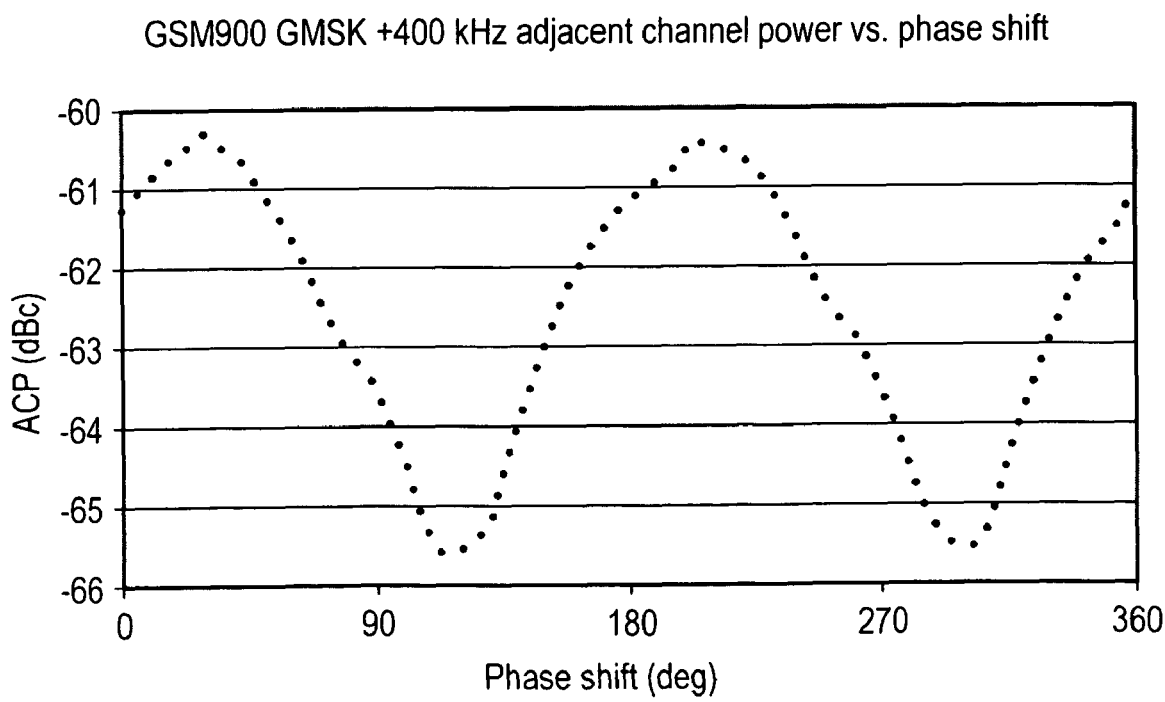
FIG. 3 is a plot of adjacent channel power vs phase shift for an embodiment of the invention.

FIG. 3 is a plot of adjacent channel power against phase shift for a GSM 900 signal at an offset frequency of +400 KHz. In the plot in FIG. 3 the carrier signal frequency is kept constant and the temperature of the apparatus 1 is also kept constant. The adjacent channel power is a measurement of the power in adjacent frequency channels. This gives an indication of the amount of interference in the adjacent channels which results in distortion of the transmitted signal. The interference may be generated by coupling between the components of the apparatus 1 as mentioned above.

The curve is approximately sinusoidal with maxima and minima separated by approximately 180 degrees. Therefore it can be seen that the best phase shift and the worst phase shift repeat every 180 degrees and that the best phase shift and the worst phase shift are approximately 90 degrees apart.

Figure 4:
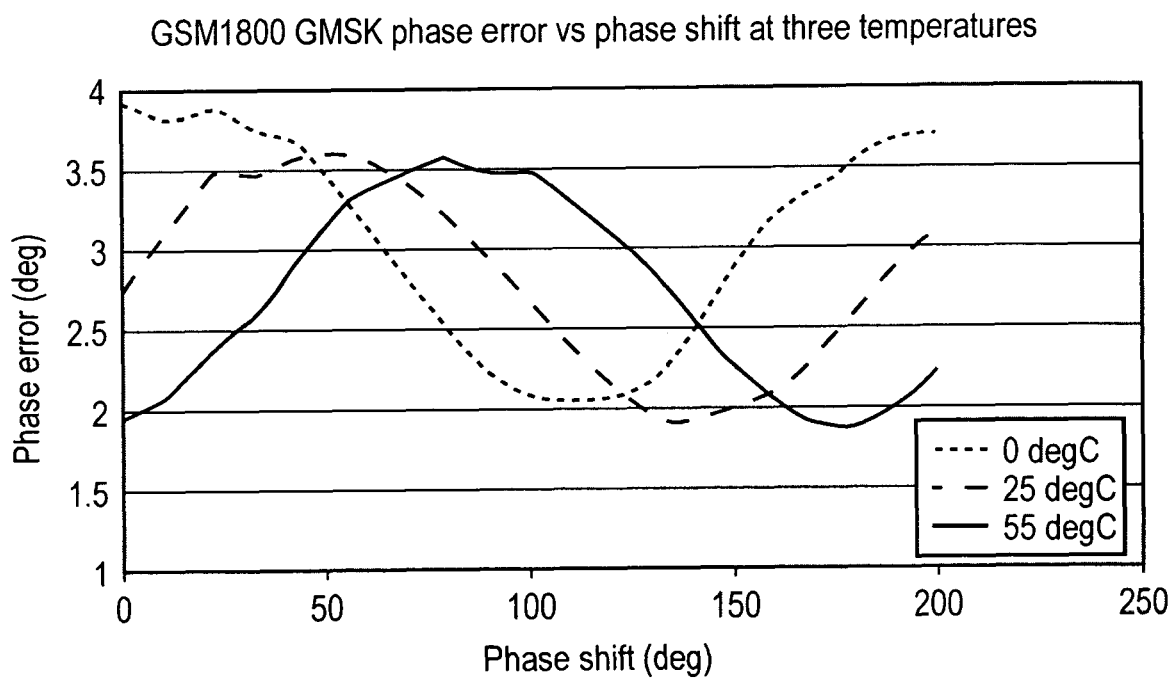
FIG. 4 is a plot of phase error vs phase shift for an embodiment of the invention.

FIG. 4 is a plot of phase error against phase shift for a GSM 1800 signal. The carrier frequency is constant however the three curves indicate the phase error vs phase shift at three different temperatures. The curve comprising the short dashes indicates the phase shift at 0° C., the curve comprising the long dashes indicates the phase shift at 25° C. and the curve comprising the solid line indicates the phase shift at 55° C.

The curves are approximately sinusoidal with maxima and minima separated by approximately 180 degrees. Therefore it can be seen that the best phase shift and the worst phase shift repeat every 180 degrees and that the best phase shift and the worst phase shift are approximately 90 degrees apart. It can also be seen that the best phase shift and the worst phase shift is heavily dependent on the temperature of the apparatus 1. Therefore in order to optimize the performance of the apparatus 1 the predetermined phase shift added by the phase shifter 11 may take into account the temperature of the apparatus 1.

Other factors which may also determine the optimum phase shift are the properties of the digital modulation used, the order of the harmonic of the interfering signals 43, for example whether they are second or higher harmonics, whether or not the output 23 of the phase locked loop 5 is divided by a divider 7 before being provided to a modulator 9 and the value of the integer by which a frequency divide divides the output signal 23. The predetermined phase shift which is added by the phase shifter 11 may take into account these factors.

In the embodiment illustrated in FIG. 1 the apparatus 1 is illustrated as a single apparatus. It is to be appreciated that the various components of the apparatus 1 may be located on different modules or chipsets. The different modules and chipsets may be combined to form a single apparatus 1. For example in one embodiment of the invention the phase locked loop 5 may be on a first chip set, the modulator may be on a second chipset and the amplifiers 13, 15 and antenna 19 may be on another chipset.

It is also to be appreciated that the arrangement of the components in FIG. 1 is schematic and different arrangements may be used. For example, in some embodiments of the invention the phase shifter 11 may be configured to add the predetermined phase shift to the carrier signal 25 which is provided to the modulator 9 or to the modulated signal 31 which is output from the modulator 9.

Figure 5:
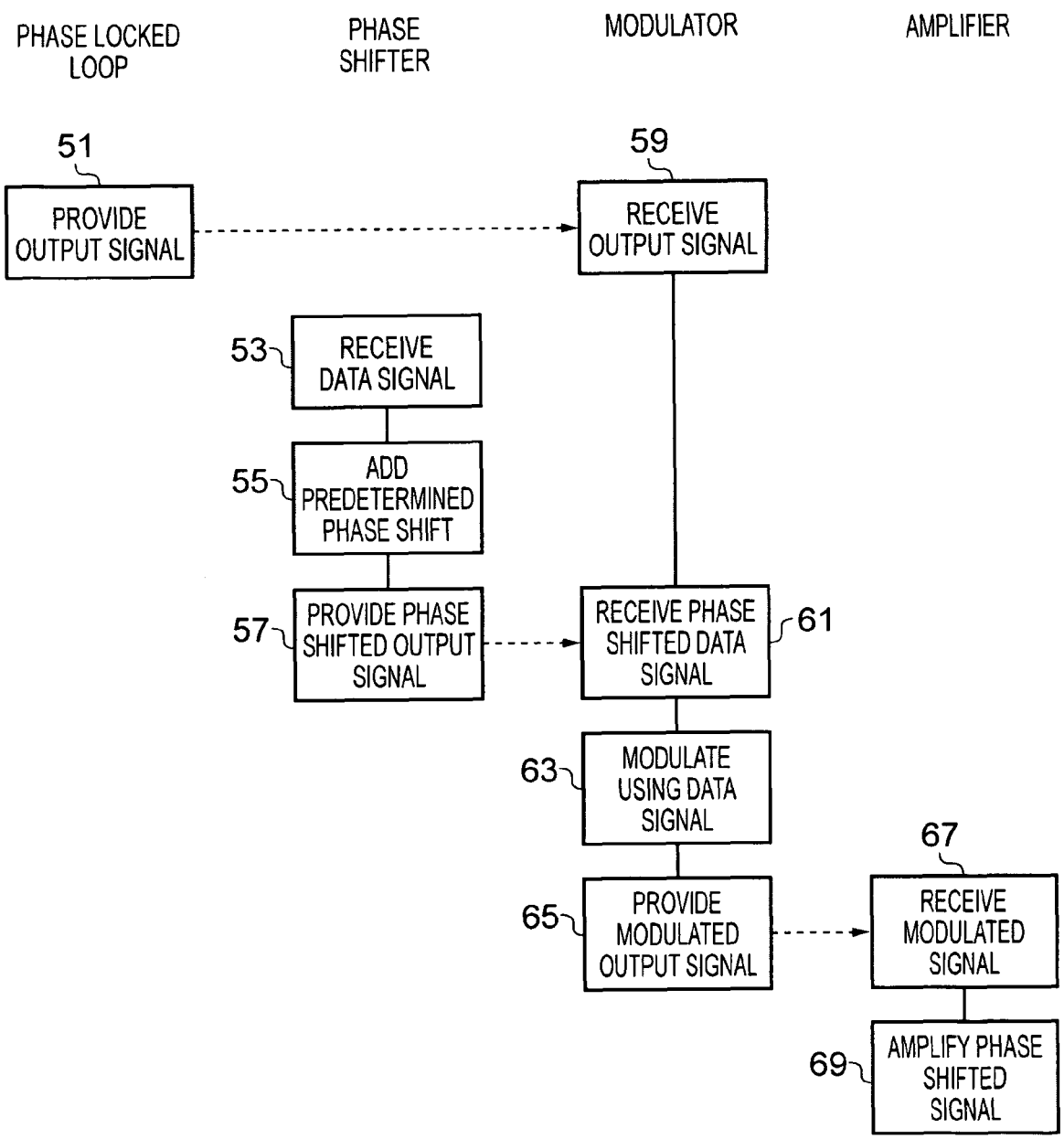
FIG. 5 illustrates of a flow chart of a method according to an embodiment of the invention.

FIG. 5 illustrates a flow chart of a method according to an embodiment of the invention. Block 51 of the method is carried out by the phase locked loop 5, blocks 53 to 57 are carried out by the phase shifter 11, blocks 59 to 65 are carried out by the modulator 9, and blocks 67 to 69 are carried out by the amplifiers 13, 15.

At block 51 the phase locked loop provides the output signal 23. The output signal 23 forms a carrier signal which may be used to enable data to be transmitted by the antenna 19.

At block 63 the phase shifter 11 receives the data signal 29. The data signal 29 comprises data which is to be transmitted by the antenna 19. At block 55 the phase shifter 11 adds a predetermined phase shift to the data signal 29. As mentioned above the predetermined phase shift which is added may be dependent upon a number of different factors. The predetermined phase shift added may be controlled by the controller 10.

As mentioned above the value of the predetermined phase shift which is added may be such that the predetermined phase shift ensures that the output signal 23 of the phase locked loop 5 is not in phase with a signal generated by the amplifiers 13, 15 or any other interfering signal 43.

At block 57 the phase shifter 11 provides the phase shifted data signal 27 as an output.

At block 59 the modulator 9 receives the output signal 23 from the phase locked loop 5. As described above the modulator 9 may receive the output signal 23 indirectly via one or more intervening components such as a frequency divider 7. In other embodiments of the invention the modulator 9 may receive the output signal 23 directly from the phase locked loop 5.

At block 61 the modulator 9 receives a second input signal. The second input signal comprises the phase shifted data signal 27 from the phase shifter 11.

At block 63 the modulator 9 uses output signal 23 of the phase locked loop 5 as a carrier signal and uses the data from the data signal 27 to modulate the carrier signal. The modulator 9 then provides, at block 65, a modulated output signal 29 which may be transmitted.

At block 67 the amplifier 13 receives the modulated signal 31 and amplifies, at block 69, the signal to be transmitted by the antenna 19.

As mentioned above the amplified signals and harmonics of these signals may couple with sensitive components such as the phase locked loop 5. However, the predetermined phase shift reduces the effect of this coupling and reduces the phase error of the transmitted signal.

The blocks illustrated in the FIG. 5 may represent steps in a method and/or sections of code in the computer program 28. The illustration of a particular order to the blocks does not necessarily imply that there is a required or preferred order for the blocks and the order and arrangement of the block may be varied. For example the predetermined phase shift may be added to the signals before they are modulated. Furthermore, it may be possible for some steps to be omitted.

Figure 6:
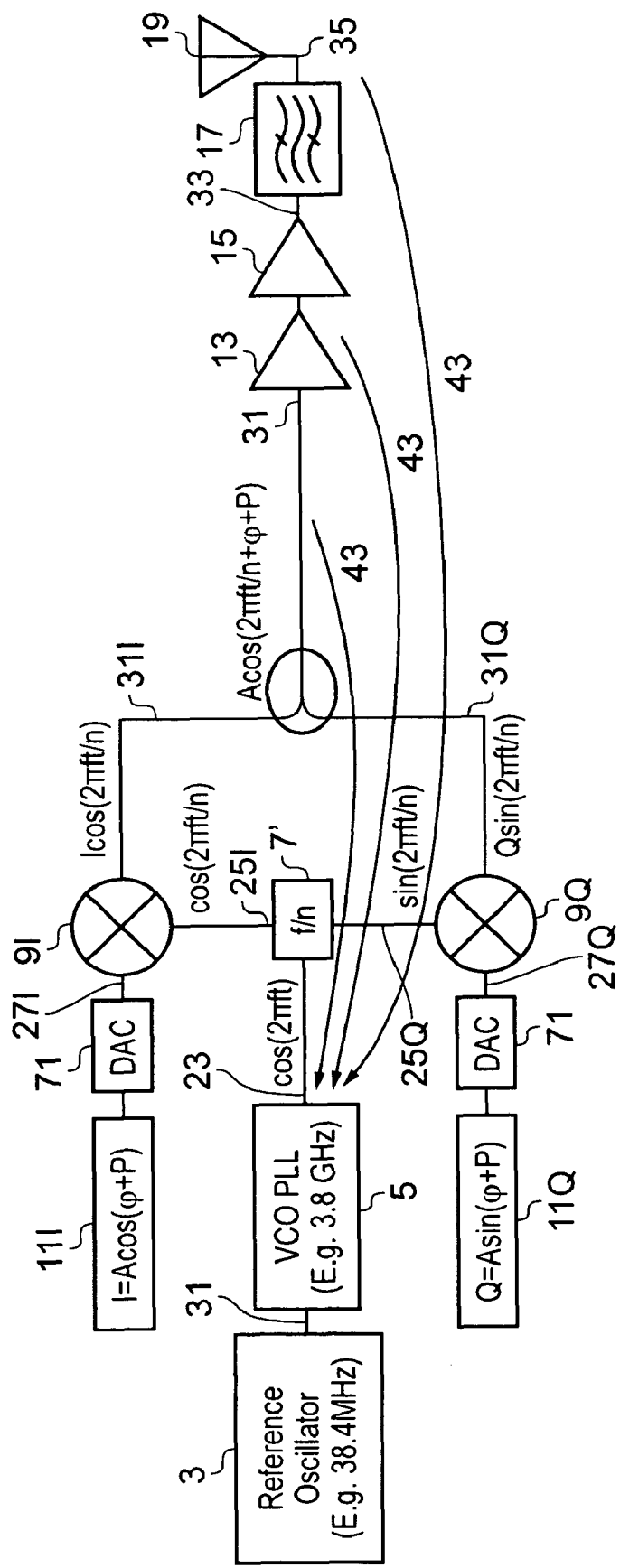
FIG. 6 is a schematic diagram of an apparatus according to another embodiment of the invention.

FIG. 6 illustrates another embodiment of the invention. The embodiment of the invention illustrated in FIG. 6 is similar to the embodiment illustrated in FIG. 1 however in this second embodiment Gaussian Minimum shift keying (GMSK) modulation is used to modulate the carrier signal for transmission. It is to be appreciated that embodiments of the invention may be used with other types of modulation.

The apparatus 1 in FIG. 6 comprises a reference oscillator 3 and a phase locked loop 5 as described above with reference to FIG. 1. The output signal 23 of the phase locked loop 5 may be written as $\cos(2\pi ft)$.

In the embodiments illustrated in FIG. 6 the phase locked loop is connected to a frequency divider 7' so that the output signal 23 of the phase locked loop 5 is provided as an input signal to the frequency divider 7'.

The frequency divider 7' in the second embodiment is similar to the frequency divider 7 of the first embodiment in that it divides the frequency of the output signal 23 of the phase locked loop 5 by the integer n to provide a reduced frequency signal. However the frequency divider 7' in the second embodiment also splits the signal into a first reduced frequency signal 25I and a second reduced frequency signal 25Q. The second reduced frequency signal 25Q is also phase shifted by ninety degrees so that the two reduced frequency signals 25I and 25Q are in quadrature with each other.

The first reduced frequency signal 25I may be written as $\cos(2\pi ft)$. This signal is still in phase with the output signal 23 from the phase locked loop 5.

The second reduced frequency signal 25Q is ninety degrees out of phase with the first reduced frequency signal 25I and the output signal 23 from the phase locked loop 5 and may be written as $\sin(2\pi ft)$.

The apparatus 1 in FIG. 6 comprises two modulators 9I and 9Q. Both of these modulators 9I, 9Q perform the same function as the modulator 9 in the previous embodiment in that they both receive a reduced frequency input signal 25I, 25Q as a first input and modulate this with a data signal 27I, 27Q which is received as a second input.

The first reduced frequency signal 25I is provided to the first modulator 9I and the second reduced frequency signal 25Q is provided to the second modulator 9Q.

Two data signals 27I and 27Q are provided. The first data signal 27I is provided to the first modulator 9I and the second data signal 27Q is provided to the second modulator 9Q. The two data signals 27I and 27Q are also ninety degrees out of phase with each other. The first data signal 27I may be written as $I=A\cos(\phi)$ and the second data signal 27Q may be written as $Q=A\sin(\phi)$.

In the illustrated embodiment of the invention the apparatus 1 comprises two phase shifters 11I and 11Q. The first phase shifter 11I adds a predetermined phase shift of value P to the first data signal 27I and the second phase shifter 11Q adds a predetermined phase shift of value P to the second data signal 27Q. As the predetermined phase shift has the same value for both of the data signals 27I and 27Q the two signals are still ninety degrees out of phase with each other after the phase shift P has been added. After the predetermined phase shift has been added the first data signal 27I may be written as $I=A\cos(\phi+P)$ and the second data signal 27Q may be written as $Q=A\sin(\phi+P)$.

As in the previously described embodiments the phase shifters 11I and 11Q may be configured to receive a control signal from a controller. The value of the predetermined phase shift added may depend upon the frequency of the input signals 25I and 25Q which are provided to the modulators 9I and 9Q. In some embodiments of the invention the value of the phase shift added may also be dependent upon the temperature of the apparatus 1 and may be independent of the data signal 27.

The predetermined phase shift which is added may ensure that the output signal 23 of the phase locked loop 5 is not in phase with a signal generated by the amplifiers 13, 15.

After the phase shift has been added the data signals 27I and 27Q may be converted to analogue signals before being provided to the respective modulators 9I and 9Q.

The modulators 9I and 9Q modulate the reduced frequency signals 25I and 25Q with the data signals to provide 27I and 27Q to provide the modulated signals 29I and 29Q as outputs. The first modulated signal 29I may be written as $$I\cos\left(\frac{2\pi ft}{n}\right)$$

where $I=A\cos(\phi+P)$. The second modulated signal 29Q may be written as $$Q\sin\left(\frac{2\pi ft}{n}\right)$$

where $Q=A\sin(\phi+P)$.

The two modulated signals 29I and 29Q are provided to a common load circuit and added back together before being provided as an input signal to the amplifiers 13, 15. The signal is then amplified and filtered by the filter 17 before being transmitted by the antenna 19 as described in relation to the previously described embodiment.

The recombined signal may be written as $$A\cos\left(\frac{2\pi ft}{n}+\varphi+P\right).$$

This signal is out of phase with the output signal 23 of the phase locked loop 5 by $\phi+P$. The value of $\phi$ is determined by the data signals 27I and 27Q. However the value of P may be selected so that the amplified signals generated by the amplifiers are not in phase with the output signal 23 of the phase locked loop 5.

Figure 7:
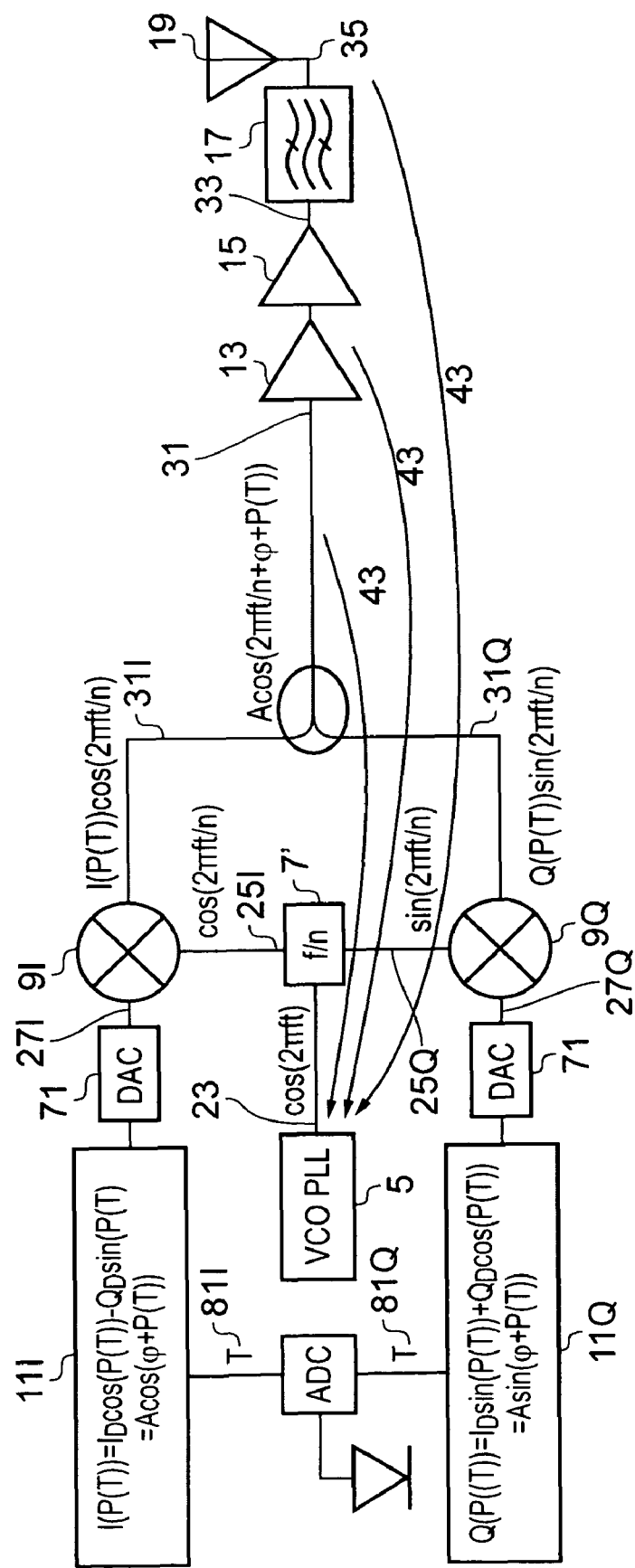
FIG. 7 is a schematic diagram of an apparatus according to a further embodiment of the invention.

FIG. 7 illustrates a further embodiment of the invention as illustrated in FIG. 6 however in this further embodiment of the invention the phase shift which is added by the phase shifters is dependent upon the temperature of the apparatus 1.

All components of the apparatus 1 in FIG. 7 are the same as in FIG. 6 except that the phase shifters 11I and 11Q have been modified. The reference oscillator 3 has not been illustrated in FIG. 7 for clarity.

In the apparatus 1 in FIG. 7 the phase shifters 11I and 11Q differ from the phase shifters of the previous embodiments in that they receive control signals 81I and 81Q which are indicative of the temperature of the apparatus 1.

The temperature of the apparatus 1 may have been measured at a particular point, for example the power amplifiers 13, 15 or the antenna 19. This information may then be provided to a controller which may be used to provide the control signals 81I and 81Q to the phase shifters 11I and 11Q. The control signals 81I and 81Q control the value of the predetermined phase shift which is added by the phase shifters 11I and 11Q in dependence upon the temperature of the apparatus 1.

After the temperature dependent predetermined phase shift has been added the first data signal 27I may be written as $$I(P(T)) = I_d \cos(P(T)) - Q_d \sin(P(T)) = A \cos(\phi + P(T))$$

and the second data signal 27Q may be written as $$Q(P(T)) = I_d \sin(P(T)) + Q_d \cos(P(T)) = A \sin(\phi + P(T)).$$

The value of P(T) may be obtained from a look up table which may be stored in a memory of a controller. The value of P(T) may also be dependent upon the frequency of the carrier signal.

As in the previously described embodiment, after the phase shift has been added the data signals 27I and 27Q may be converted to analogue signals before being provided to the respective modulators 9I and 9Q.

The modulators 9I and 9Q modulate the reduced frequency signals 25I and 25Q with the data signals to provide 27I and 27Q to provide the modulated signals 29I and 29Q as outputs. The first modulated signal 29I may be written as $$I(P(T)) \cos\left(\frac{2\pi f t}{n}\right)$$

and the second modulated signal 29Q may be written as $Q(P(T)) \sin\left(\frac{2\pi f t}{n}\right)$.

The two modulated signals 29I and 29Q are added back together before being provided as an input signal to the amplifiers 13, 15 as described above.

The recombined signal may be written as $$A \cos\left(\frac{2\pi f t}{n} + \varphi + P(T)\right).$$

This signal is out of phase with the output signal 23 of the phase locked loop 5 by φ+P(T). The value of φ is determined by the data signals 27I and 27Q. However the value of P(T) is determined so that the amplified signals generated by the amplifiers are not in phase with the output signal 23 of the phase locked loop 5. As the value of the temperature may change during use of the apparatus, the value of P(T) may also change.

Although embodiments of the present invention have been described in the preceding paragraphs with reference to various examples, it should be appreciated that modifications to the examples given can be made without departing from the scope of the invention as claimed.

As used in the above description 'module' refers to a unit or apparatus that excludes certain parts/components that would be added by an end manufacturer or a user.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a modulator comprising a first input for receiving a data signal and a second input for receiving an output signal from a phase locked loop wherein the modulator is for modulating the output signal from the phase locked loop using the data signal and providing the modulated signal to an output for connection to an amplifier; and
   a phase shifter configured to result in a predetermined phase shift to the modulated signal wherein the phase shifter is configured to add the predetermined phase shift to the data signal which is provided to the modulator.

2. An apparatus as claimed in claim 1 wherein the predetermined phase shift is dependent upon the temperature of the apparatus.

3. An apparatus as claimed in claim 1 wherein the predetermined phase shift is dependent upon the frequency of the output signal of the phase locked loop.

4. An apparatus as claimed in claim 1 wherein the predetermined phase shift is independent of the data signal.

5. An apparatus as claimed in claim 1 wherein the predetermined phase shift prevents an interfering signal from having the same phase as the output signal of the phase locked loop.

6. An apparatus as claimed in claim 5 wherein the interfering signal is an output signal of an amplifier.

7. An apparatus as claimed in claim 5 wherein the interfering signal is an output signal of an antenna.

8. A method comprising:
   modulating, using a data signal, an output signal from a phase locked loop;
   adding a predetermined phase shift such that the predetermined phase shift results in a phase shift of the modulated signal; and
   providing the modulated signal for connection to an amplifier the predetermined phase shift is added to the data signal.

9. A method as claimed in claim 8 wherein the predetermined phase shift is dependent upon the temperature of the apparatus.

10. A method as claimed in claim 8 wherein the predetermined phase shift is dependent upon the frequency of the output signal of the phase locked loop.

11. A method as claimed in claim 8 wherein the predetermined phase shift prevents an interfering signal from having the same phase as the output signal of the phase locked loop.

12. A computer-readable storage medium encoded with instructions that, when executed by a processor, perform the method as claimed in claim 8.

13. An apparatus comprising:
 a phase locked loop for providing an output signal at a first frequency;
 a modulator comprising a first input for receiving a data signal and a second input for receiving an output signal from a phase locked loop wherein the modulator is for modulating the output signal from the phase locked loop using the data signal and providing the modulated signal to an output;
 an amplifier connected to receive the modulated signal from the modulator; and
 a phase shifter configured to introduce a predetermined phase shift into the signal provided to the amplifier wherein the predetermined phase shift is configured to reduce the effect of coupling between an interfering signal and the phase locked loop to stabilise the output of the phase locked loop wherein the phase shifter is configured to add the predetermined phase shift to the data signal which is provided to the modulator.

14. An apparatus as claimed in claim 13 wherein the predetermined phase shift is dependent upon the temperature of the apparatus.

15. An apparatus, comprising:
 at least one processor; and
 at least one memory including computer program code, the at least one memory and the computer program code configured to, with the at least one processor, cause the apparatus at least to:
 modulate, using a date signal, an output signal from a phase locked loop;
 add a predetermined phase shift such that the predetermined phase shift results in a phase shift of the modulated signal; and
 provide the modulated signal for connection to an amplifier wherein the predetermined phase shift is added to the data signal.

16. The apparatus of claim 15, wherein the predetermined phase shift is dependent upon the temperature of the apparatus.

17. The apparatus of claim 15, wherein the predetermined phase shift is dependent upon the frequency of the output signal of the phase locked loop.

18. The apparatus of claim 15, wherein the predetermined phase shift prevents an interfering signal from having the same phase as the output signal of the phase locked loop.

19. The apparatus of claim 15, wherein the predetermined phase shift is independent of the data signal.

20. The apparatus of claim 19, wherein the interfering signal is an output signal of an amplifier.

21. The apparatus of claim 19, wherein the interfering signal is an output signal of an antenna.

\* \* \* \* \*